United States Patent [19]

Aswell

[11] 4,451,742

[45] May 29, 1984

[54] POWER SUPPLY CONTROL FOR INTEGRATED CIRCUIT

[75] Inventor: Cecil J. Aswell, Coppell, Tex.

[73] Assignee: Mostek Corporation, Carrollton, Tex.

[21] Appl. No.: 560,253

[22] PCT Filed: May 27, 1981

[86] PCT No.: PCT/US81/00705

§ 371 Date: May 27, 1981

§ 102(e) Date: May 27, 1981

[87] PCT Pub. No.: WO80/02644

PCT Pub. Date: Dec. 11, 1980

Related U.S. Application Data

[63] Continuation of Ser. No. 282,179, May 27, 1981, abandoned.

[51] Int. Cl.³ .............................................. H02J 9/06
[52] U.S. Cl. .................................... 307/66; 365/229; 371/66
[58] Field of Search .................. 307/65, 66; 365/201, 365/229; 371/66

[56] References Cited

U.S. PATENT DOCUMENTS

| | | | |
|---|---|---|---|
| 3,555,290 | 1/1971 | Ellermeyer | 307/65 |
| 3,573,483 | 4/1971 | White | 307/66 |
| 3,859,638 | 1/1975 | Hume | 365/229 |
| 4,143,283 | 3/1979 | Grof et al. | 307/66 |

OTHER PUBLICATIONS

Bodner, R. E. *I.B.M. Technical Disclosure Bulletin* "Fault Indication for Multiple Power Supplies," vol. 17, No. 1, Jun. 1974, pp. 175-177.

Rayner, D. *New Electronics,* "Battery Back-Up Voltage Monitor," vol. 13, No. 19, Sep. 30, 1980, p. 38.

*Primary Examiner*—E. A. Goldberg
*Assistant Examiner*—Todd E. DeBoer

[57] ABSTRACT

A power supply control circuit (20) selectively provides power to an integrated circuit from either a primary power supply terminal (22), or through terminals (24, 26) connected to backup batteries. The voltage level of the primary power is monitored continuously and when it drops to a predetermined level one of the two backup batteries is substituted to power the integrated circuit in a power-down mode. The circuit (20) includes a level detector circuit (32) and a voltage reference circuit (98). In the power-down mode one battery is connected to power the integrated circuit and this battery is continuously monitored. When the voltage of the on-line battery drops to below a fixed level in comparison to off-line battery a control logic circuit (92) activates switches (56) to substitute the off-line battery for the on-line battery. Control logic circuitry (92) is provided to disconnect the control signals from the integrated circuit to prevent loss of stored information. Further the failure of one of the backup batteries is indicated by disabling a write enable signal.

15 Claims, 10 Drawing Figures

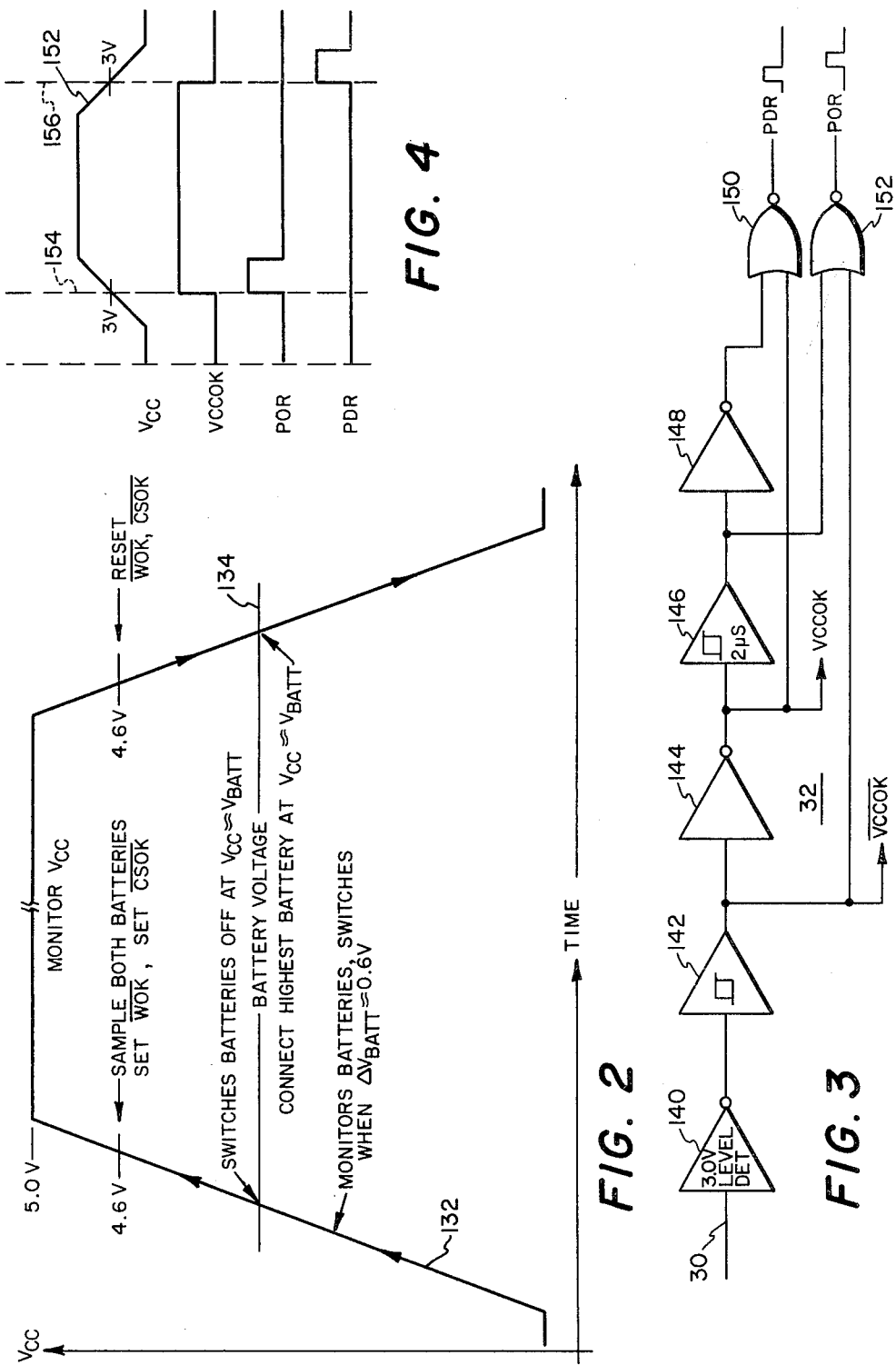

4,451,742

POWER SUPPLY CONTROL FOR INTEGRATED CIRCUIT

This application is a continuation of application Ser. No. 282,179, filed May 27, 1981, now abandoned.

TECHNICAL FIELD

The present invention pertains to the supplying of power to an integrated circuit and more particularly to the supplying of backup power from batteries to an integrated circuit.

BACKGROUND OF THE INVENTION

In the application for semiconductor memories there are requirements for nonvolatile data storage, that is, retaining stored information despite loss of the supply voltage. Current methods for achieveing nonvolatile storage include erasable and electronically alterable read only memories, bubble memories and CMOS memories with an external battery. Each of the present approaches has distinct drawbacks. The erasable read only memories require high voltages, have slow writing and in some cases have a block erase. Further the erasable memories require exposure to ultraviolet light for 10–30 minutes. The electronically alterable memories have a limited number of writes cycles and therefore a limited lifetime. The bubble memories have relatively slow read and write cycles and at present are quite expensive. The use of an external battery to back up a CMOS memory requires additional mounting space, added circuitry and extra expense.

In view of the above problems with nonvolatile storage there exists a need for a control circuit for providing primary and battery power to a semiconductor circuit, especially memory circuits.

SUMMARY OF THE INVENTION

A selected embodiment of the present invention comprises a method for providing power to an integrated circuit from one of a plurality of sources. In a first step the voltages of first and second backup power sources are compared to select the one having the higher voltage. The backup power source having the higher voltage is connected to supply power to the integrated circuit. The voltages of a primary power source and the backup power source having the higher voltage are compared. The primary power source is connected to supply power to the integrated circuit when the voltage of the primary power source exceeds the voltage of the backup power source having the higher voltage by a preset threshold. In a further aspect of the present invention the control signal inputs to the integrated circuit are disabled when the voltage of the primary power source becomes less than that of a predetermined voltage.

BRIEF DESCRIPTION OF THE DRAWINGS

For a more complete understanding of the present invention and the advantages thereof, reference is now made to the following description taken into conjunction with the accompanying drawings in which:

FIG. 2 is a chart illustrating the operation of the circuit shown in FIG. 1 as a function of the supply voltage $V_{cc}$;

FIG. 3 is a schematic illustration of the VCCOK circuit shown in FIG. 1;

FIG. 4 is an illustration of various wave forms which are generated by the circuit shown in FIG. 3;

DETAILED DESCRIPTION

Figure 1:
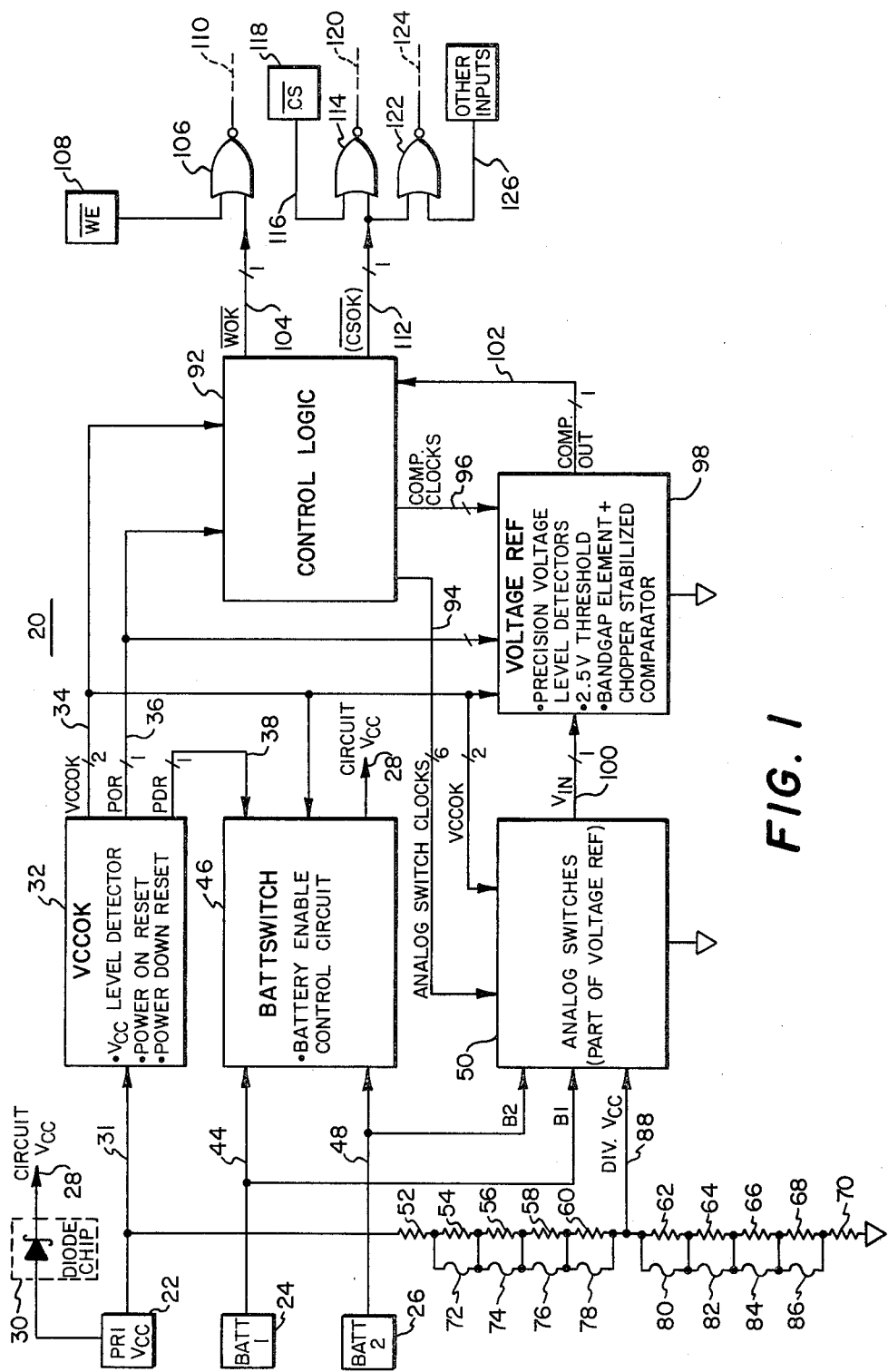
FIG. 1 is a block diagram of the power control circuit of the present invention.

The circuit of the present invention is illustrated in block diagram form in FIG. 1. Circuit 20 serves to provide power to an integrated circuit (not shown). The power can be provided from any one of three sources. The first source is the conventional primary power supplied through a circuit board to a pin of the integrated circuit. This is referred to as primary $V_{cc}$ and is received at a terminal 22. A second source of power is a first battery which is connected to a terminal 24. A third source of power is a second battery which is connected to a terminal 26. In a selected embodiment the circuit is fabricated as an integral part of a CMOS integrated circuit memory.

A package for housing the operational integrated circuit, batteries and circuit of the present invention is described in copending application entitled INTEGRATED CIRCUIT PACKAGE WITH BATTERY HOUSING filed May 27, 1981 Ser. No. 282,183 which application is assigned to the assignee of this application.

In a preferred embodiment of the present invention the circuit 20 provides power to a CMOS memory for conventional operation and to maintain data in the memory in a power down mode.

The power supplied to the integrated circuit is designated as circuit $V_{cc}$. This power is supplied to a terminal marked by the reference numeral 28. When the primary $V_{cc}$ is at a sufficient level, it is transmitted directly through a diode 30 to the terminal 28. When the primary $V_{cc}$ is less than a preset voltage one of the two batteries is connected to the terminal 28 to supply power to maintain operation of the integrated circuit in the power down mode. Thus, the integrated circuit powered by the circuit 20 receives a continuous source of power despite loss of the primary operating power.

Terminal 22 is connected to a line 31 which serves as an input to a circuit 32 labeled as VCCOK. Circuit 32 produces three output signals. The first is VCCOK which indicates the status of the primary power source, the second is POR which stands for Power On Reset and the third is PDR which stands for Power Down Reset. These three signals are transmitted respectively through lines 34, 36 and 38.

The first battery is connected through terminal 24 to a line 44 which provides a first input to a circuit 46 that is labeled BATTSWITCH. The second battery is connected through terminal 26 to a line 48 that is connected as a second input to circuit 46. The circuit 46 selectively connects the first or second battery or neither of the batteries to terminal 28.

Lines 44 and 48 are also connected to a circuit 50 which comprises a plurality of analog switches.

Analog ground is illustrated by an arrow and digital ground is illustrated by the three horizontal bar ground symbol.

Line 31 is connected to a series group of resistors 52–70, the last of which is connected to ground. Resistors 54–68 have fusable links 72–86 connected respectively in parallel therewith. A node 88 is connected at the junction of resistors 60 and 62. The links 72–86 are selectively opened to form a precision voltage divider network between line 31, node 88 and ground. The links 72–86 are preferably opened by applying a laser pulse thereto. The fusable links are opened in such a fashion that the application of 4.625 volts at line 30 results in 2.5 volts at node 88.

The signals VCCOK and POR on lines 34 and 36 are input to a control logic circuit 92. Circuit 92 produces a plurality of analog switch clock signals which are transmitted through a line 94 to the circuit 50. Note that one line may carry a plurality of signals. The signal VCCOK on line 34 is likewise transmitted to circuit 50. The circuit 92 also generates comparator clock signals which are transmitted through a line 96 to a voltage reference circuit 98. The POR signal on line 36 is transmitted to circuit 98. The voltage reference circuit 98 receives an input voltage through line 100 from the analog switch circuit 50. Circuit 98 produces a comparator output signal which is transmitted through a line 102 to the control logic circuit 92.

The control logic circuit 92 produces an output signal $\overline{WOK}$ on line 104. The signal $\overline{WOK}$ indicates that the semiconductor memory circuit, not shown, can receive a write command. The line 104 is connected as a first input to a NOR gate 106 which has the second input thereof connected to a write enable input terminal 108. The output of gate 106 is transmitted through a line 110 to the integrated circuit memory, not shown.

The circuit 92 further produces a $\overline{CSOK}$ signal which indicates that the integrated circuit memory can receive a chip select command. The signal $\overline{CSOK}$ is transmitted to a line 112 to the first input of a NOR gate 114 which has the second input thereof connected through a line 116 to a chip select terminal 118. The output of gate 114 is transmitted through a line 120 to the integrated circuit memory, not shown. The $\overline{CSOK}$ signal on line 112 is further connected to the input of a NOR gate 122 which provides an output on the line 124 to the integrated circuit memory. The second input of gate 122 is connected through a line 126 to another input terminal of the integrated circuit. The remaining terminals of the integrated circuit are connected likewise through gates such as 122.

Referring now to FIG. 2 there is illustrated a chart which illustrates the operation of the circuit 20. Line 132 represents the primary $V_{cc}$ which is the conventional power provided to the integrated circuit memory. This voltage is shown as a function of time. The voltage of the batteries is shown by line 134.

When the primary supply is at a voltage less than that shown by line 134 the circuit 20 monitors the voltage level of both of the batteries. In this condition the operational circuit is in a power down mode. One of the batteries is connected on-line to supply the backup power to the operational integrated circuit. When the voltage of the on-line battery drops to approximately 0.6 volts below that of the backup battery the circuit 20 switches from one battery to the other. This provides an automatic transfer when the energy in the on-line battery is exhausted, the battery is removed or becomes defective.

When the primary supply voltage, line 132, transitions from below line 134 to above line 134 the primary power source provided through terminal 22 forward biases diode 30 thus connecting the integrated circuit to the primary power source. But as long as the primary supply is below a preset operational level, 4.6 volts in this example, the signal $\overline{WOK}$ and $\overline{CSOK}$ are set such that the operational integrated circuit memory cannot receive a write enable command or chip select command. Thus data cannot be read from or written into the memory in this state.

As the primary supply voltage continues to increase and reaches the 4.6 volt operational level the circuit 20 samples both batteries and sets the signals designated as $\overline{WOK}$ and $\overline{CSOK}$ if the batteries check good. The setting of these two signals permits the integrated circuit memory, not shown, to function in a conventional manner which permits both reading and writing. However, if either battery checks bad $\overline{CSOK}$ is set to permit reading of the memory but $\overline{WOK}$ is not set thereby preventing writing in the memory. This serves as a warning to the system using the memory that there is a defective battery. The circuit 20 also rechecks the primary voltage and if it has dropped to below 4.6 volts the procedure is repeated.

When the primary supply voltage, shown by line 134, transitions from above 4.6 volts to below 4.6 volts the signals $\overline{WOK}$ and $\overline{CSOK}$ are reset to prohibit reading and writing of the memory.

As the primary supply voltage transitions to below line 134 the integrated circuit memory is disconnected from the primary supply when the diode 30 is no longer forward biased. The memory is then connected to the battery having the highest voltage. At this state the circuit 20 again monitors the voltage levels of the two batteries and switches from the on-line battery to the backup battery when the voltage of the on-line battery drops to approximately 0.6 volts below that of the backup battery.

Each of the blocks of the circuit 20 shown in FIG. 1 are described below in detail.

Referring now to FIG. 3 there is illustrated the circuit 22 which is designated as VCCOK. Circuit 32 functions as an approximate level detector for controlling the transitions between the primary power supply and the backup batteries. Line 31 is connected to the input of a 3.0 volt level detector 140. The output of level detector 140 is connected to the input of a Schmidt trigger circuit 142. The output of circuit 142 is the signal $\overline{VCCOK}$.

The output of circuit 142 is connected to the input of an inverter 144 which produces the signal VCCOK. The output of inverter 144 is connected to the input of a Schmidt trigger circuit 146 which includes a time delay of approximately 2 microseconds.

The output of circuit 146 is connected to the input of an inverter 148. The output of invertor 148 is connected as the first input to a NOR gate 150. The second input to gate 150 is the signal VCCOK. The gate 150 produces the PDR (Power Down Reset) signal.

A NOR gate 152 has a first input thereof connected to the output of circuit 146 and the second input thereof connected to receive the signal $\overline{VCCOK}$. Gate 152 produces the POR (Power On Reset) signal.

FIG. 4 illustrates signal waveforms which occur in the circuit 32 shown in FIG. 3. The primary power source is illustrated as line 152. A 3.0 volt reference level on line 152 is that of the level detector circuit 140. The primary power passes through the 3.0 volt level at the point illustrated by vertical-lines 154 and 156.

The signal VCCOK transitions from a low state to a high state when the primary power makes a positive transition through the 3.0 volt level. The signal VCCOK makes a downward transition when the primary power makes a negative transition through the 3.0 volt level. The signal POR has a pulse at the positive transition of the signal VCCOK. The signal PDR has a pulse immediately following the negative transition of signal VCCOK.

Figure 5:
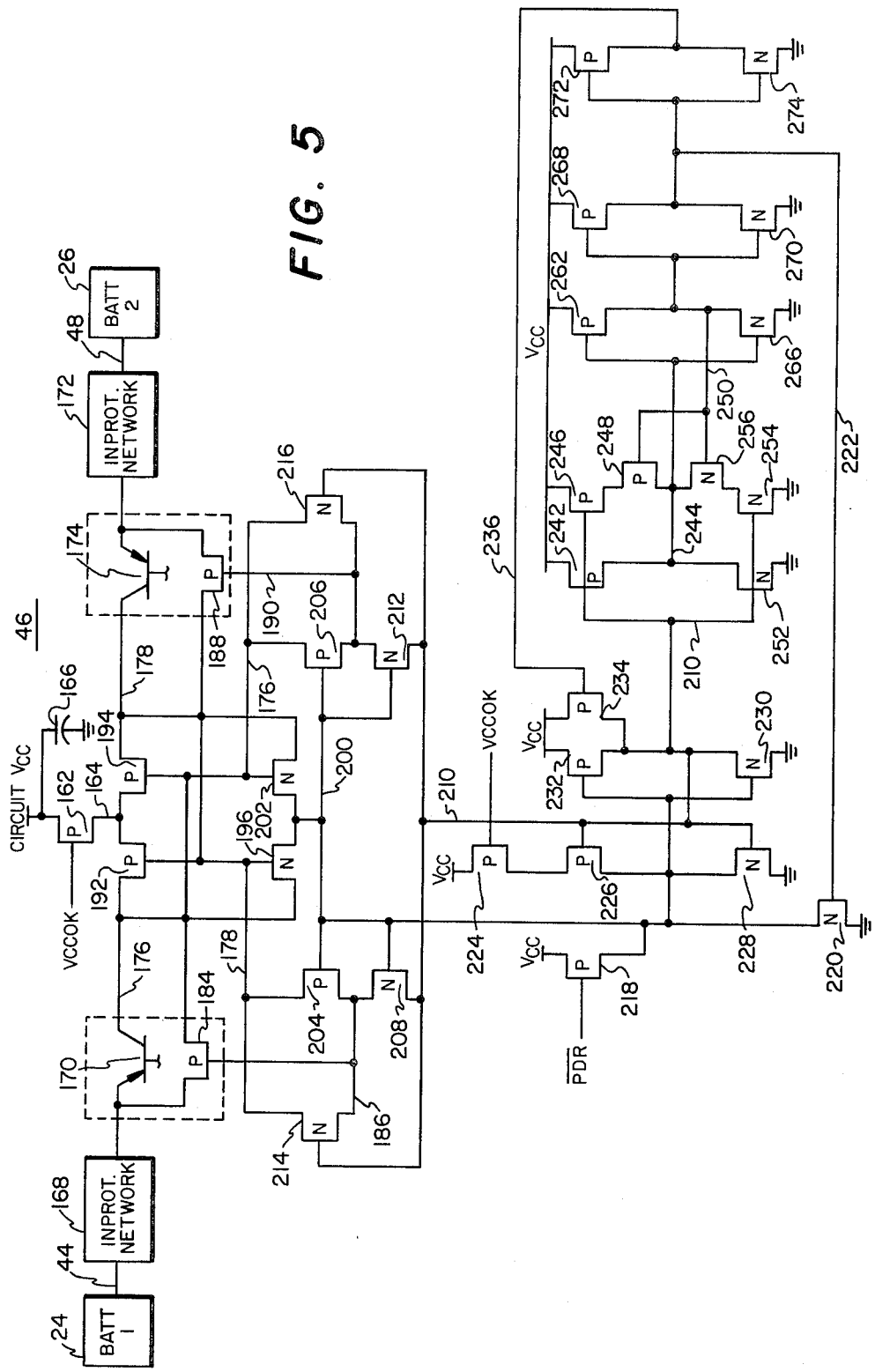
FIG. 5 is a schematic illustration of the BATT-SWITCH circuit shown in FIG. 1.

The BATTSWITCH circuit 46 is illustrated in detail in FIG. 5. This circuit serves to switch from one battery to the other when the circuit 20 is in the power down mode. The circuit $V_{cc}$ is connected to terminal 28 which is in turn connected to a transistor 162 which receives the VCCOK signal at the gate terminal thereof. The transistor 162 is further connected to a node 164. A parasitic junction capacitance 166 is connected between terminal 28 and ground. Capacitance 166 stores sufficient charge to permit a transfer of batteries without a significant loss of voltage at terminal 28.

The first battery is connected through terminal 24 and line 44 through an input protection network 168 to a bipolar transistor 170. The second battery is connected through terminal 26, line 48 and through an input protection network 172 to a bipolar transistor 174. Transistor 170 has the emitter terminal thereof connected to network 168, the base terminal thereof connected to the substrate of the integrated circuit and the collector terminal thereof connected a node 176. The transistor 174 has the emitter terminal thereof connected to network 172, the base terminal thereof connected to the circuit substrate and the collector terminal thereof connected to a node 178. The bipolar transistors 170 and 174 are the resulting parasitic PNP junctions resulting from the fabrication of a p-channel transistor. This parasitic PNP structure is deliberately utilized as a bipolar transistor in circuit 46.

An MOS transistor 184 has the drain and source terminals thereof connected in parallel with the emitter and collector terminals of bipolar transistor 170. The gate terminal of transistor 184 is connected to a node 186. An MOS transistor 188 has the source and drain terminals thereof connected in parallel with the collector and emitter terminals of bipolar transistors 174. The gate terminal of transistor 188 is connected to a node 190. The first battery is connected to the circuit substrate through the structure comprising transistors 170 and 184. The second battery is connected to the circuit substrate through the structure comprising transistors 172 and 188.

A transistor 192 has the source and drain terminals thereof connected between nodes 164 and 176 and the base terminal thereof connected to node 178. A transistor 194 has the source and drain terminals thereof connected between nodes 164 and 178 and the base terminal thereof connected to node 176.

A transistor 196 has the drain and source terminals connected between node 176 and a node 200 and the base terminal thereof connected to node 178. A transistor 202 has the drain and source terminals thereof connected between nodes 178 and 200 and the base terminal thereof connected to node 176. The transistors 192, 194, 196 and 202 are connected as cross coupled inverters with transistors 192 and 196 being a first inverter and transistors 194 and 202 being a second inverter.

A transistor 204 has the source terminal thereof connected to node 178, the drain terminal thereof connected to node 186 and the base terminal thereof connected to node 200.

A transistor 206 at the source terminal thereof connected to node 176, the drain terminal thereof connected to node 190 and the base terminal thereof connected to node 200.

A transistor 208 has the drain terminal thereof connected to node 186, the source terminal thereof connected to a node 210 and the base terminal thereof connected to node 200.

A transistor 212 has the drain terminal thereof connected to node 190, the source terminal thereof connected to node 210 and the base terminal thereof connected to node 200.

A transistor 214 has drain terminal thereof connected to node 178, the gate terminal thereof connected to node 210 and the source terminal thereof connected to node 186. A transistor 216 has the drain terminal thereof connected to node 176, the gate terminal thereof connected to node 210 and the source terminal thereof connected to node 190.

A transistor 218 has the source terminal thereof connected to the circuit $V_{cc}$, the drain terminal thereof connected to node 200 and the base terminal connected to receive the signal $\overline{PDR}$. A transistor 220 has the drain terminal thereof connected to node 200, the source terminal thereof grounded and the base terminal thereof connected to a node 222.

A transistor 224 has the source terminal thereof connected to the circuit $V_{cc}$, the gate terminal thereof connected to receive the signal VCCOK and the drain terminal thereof connected to the source terminal of a transistor 226. The gate terminal of transistor 226 is connected to node 210 and the drain terminal of transistor 226 is connected to node 200. A high impedance transistor 228 has the drain terminal thereof connected to node 200, the source terminal thereof connected to ground and the base terminal thereof connected to node 210.

A transistor 230 has the drain terminal thereof connected to node 210, the gate terminal thereof connected to node 200 and the source terminal thereof connected to ground. A transistor 232 has the source terminal thereof connected to the circuit $V_{cc}$, the gate terminal thereof connected to node 200 and the drain terminal thereof connected to node 210. A transistor 234 has the source terminal thereof connected to the circuit $V_{cc}$, the drain terminal thereof connected to node 210 and the gate terminal thereof connected to a node 236.

A transistor 242 has the source terminal thereof connected to the circuit $V_{cc}$, the gate terminal thereof connected to node 210 and the drain terminal thereof connected to a node 244.

A transistor 246 has the source terminal thereof connected to the circuit $V_{cc}$, the gate terminal thereof connected to node 210 and the drain terminal thereof connected to the source terminal of a transistor 248. The gate terminal of transistor 248 is connected to a node 250 while the drain terminal thereof is connected to node 244.

A transistor 252 has the drain terminal thereof connected to node 244, the gate terminal thereof connected to node 210 and the source terminal thereof grounded. A transistor 254 has the gate terminal thereof connected to node 210, the source terminal thereof grounded and the drain terminal thereof connected to the source terminal of a transistor 256. The gate terminal of transistor 256 is connected to node 250 and the drain terminal thereof is connected to node 244.

A transistor 262 has the source terminal thereof connected to the circuit $V_{cc}$, the gate terminal thereof connected to node 244 and the drain terminal thereof connected to a node 250. A transistor 266 has the drain terminal thereof connected to node 250, the gate terminal thereof connected to node 244 and the source terminal thereof grounded.

A transistor 268 has the source terminal thereof connected to the circuit $V_{cc}$, the gate terminal thereof connected to node 250 and the drain terminal thereof connected to node 222. A transistor 270 has the drain terminal thereof connected to node 222, the gate terminal thereof connected to node 250 and the source terminal thereof grounded.

A transistor 272 has a source terminal thereof connected to the circuit $V_{cc}$, the gate terminal thereof connected to node 222 and the drain terminal thereof connected to node 236. A transistor 274 has the drain terminal thereof connected to node 236, the gate terminal thereof connected to node 222 and the source terminal thereof grounded.

Operation of the battery switching circuit 46 is now described in reference to FIG. 5. The circuit 46 operates to connect one of the two batteries to an integrated circuit memory, not shown, through terminal 28 when the circuit 20 is in a power down mode. Under these conditions the signal VCCOK is a low state thus turning transistor 162 on and connecting the circuit $V_{cc}$ at terminal 28 to node 164.

In the power down mode only one of the two batteries is connected to provide power to the integrated circuit. The on-line battery is connected to the substrate of the integrated circuit for a CMOS configuration and this substrate is in turn connected to the base terminals of the bipolar transistors 170 and 174. Assuming that battery 2 is on, line transistor 188 will be turned on. Transistor 184 will be turned off. The inverter comprising transistors 194 and 202 will be set such that transistor 194 is on and transistor 202 is off. Likewise for the inverter comprising transistors 192 and 196 transistor 192 is turned off and transistor 196 is turned on.

When the off-line battery, in this example battery 1, has a voltage that is approximately 0.6 volts greater than that of the on-line battery the transistor 170 will be forward biased. Current will then flow through transistor 170 into node 176. Since transistor 196 is turned on the current will flow into node 200. Node 200 is connected to the drain terminal of transistor 228 which is fabricated to have a high impedance. When no current is flowing through transistor 228 node 200 is maintained at a low voltage level. But when current flows through transistor 228 node 200 is pulled to a higher voltage level. As the voltage at node 200 increases transistor 230 will be turned on thereby pulling node 210 to a lower voltage state. Node 210 is connected to the gate terminal of transistor 228 and will tend to turn off transistor 228. The transistors 228 and 230 are connected in a positive feedback arrangement such that the slight increase in voltage at node 200 becomes a sudden shift and node 200 is pulled to a high voltage state and node 210 is pulled to ground.

In this condition transistors 208 and 212 are turned on and transistors 204 and 206 are turned off. All of the latch transistors 192, 194, 196 and 202 are also turned off since there is no voltage differential across the latches. However, the low voltage state at node 210 is propagated through transistors 208 and 212 to the gate terminals of transistors 184 and 188 to turn these transistors on. Thus node 176 is pulled to the potential of battery 1 and node 178 is pulled to the potential of battery 2. In this example the potential of battery 1 is approximately 0.6 volts above that of battery 2.

As noted earlier, transistor 230 is turned on pulling node 210 to ground. This state is transmitted to the group of transistors 242, 246, 248, 252, 254, 256, 262 and 266 which comprise a Schmidt trigger circuit. The output of this circuit is then transmitted through an inverter circuit comprising transistors 268 and 270 to produce a high voltage state on node 222. This serves to turn on transistor 220 and pull node 200 to ground. There is a time delay through the Schmidt trigger circuit.

As node 200 is pulled to ground transistor 202 is turned on due to the voltage at node 176. Transistor 196 is not turned on since the voltage at node 178 is less than that at node 176. As transistor 202 is turned on node 178 is pulled to ground by conduction through transistor 202.

As node 200 is pulled to ground transistor 230 is turned off and node 210 is pulled to a high voltage state.

With node 200 at a low state and node 210 at a high state transistors 208 and 212 are turned off and transistors 204 and 206 are turned on. The low state at node 178 is propagated through transistor 204 to turn on transistor 184. The high voltage state at node 176 is propagated through transistor 206 to turn off transistor 188. Further, the low voltage state at node 178 turns on transistor 192 and the high voltage at node 176 turns off transistor 194. Thus the second battery is disconnected from terminal 28 and the first battery is connected to terminal 28.

When node 210 is pulled to a low voltage state, the Schmidt trigger is activated and a low voltage state is produced at node 222. Under a selected design the Schmidt trigger has a time delay of several hundred nanoseconds. There is thus produced a negative transition at the node 222 after node 210 goes to a low voltage state. This state on node 222 serves to turn off transistor 220 thus isolating node 200 and permitting it to be pulled near ground by the high impedance transistor 228. Under these conditions node 200 is low and node 210 is high thus reestablishing the initial conditions of the circuit.

Figure 6:
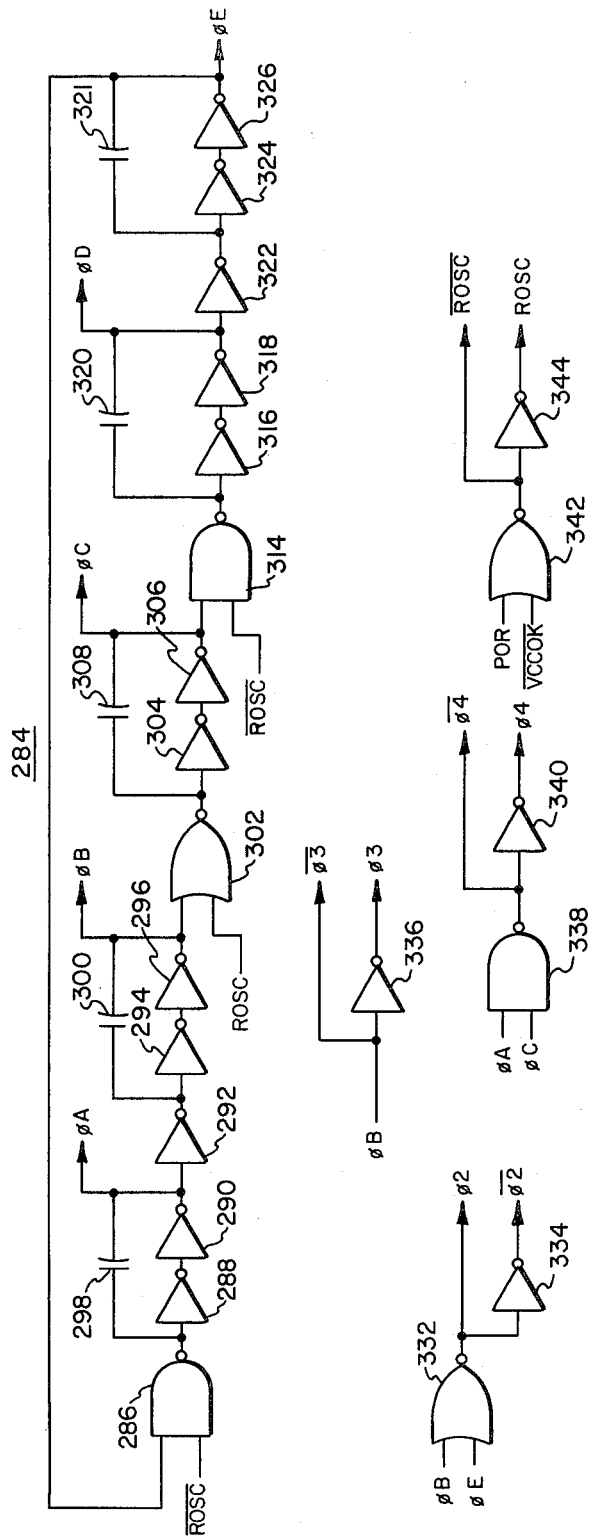
FIG. 6 is a schematic illustration of a portion of the CONTROL LOGIC circuit shown in FIG. 1.

Referring now to FIG. 6 there is illustrated a ring oscillator 284 which comprises a portion of a control logic circuit 92 illustrated in FIG. 1. Circuit 284 produces a plurality of clock signals which are utilized to drive other circuit elements in circuit 20. Circuit 284 includes a serial connection of a NAND gate 286, an inverter 288, an inverter 290, an inverter 292, an inverter 294, and an inverter 296. A capacitor 298 is connected between the output of gate 286 and the input of inverter 292. A capacitor 300 is connected between the output of inverter 292 and the first input of a NOR gate 302.

The output of gate 302 is connected to the input of an inverter 304 which is in turn connected to an inverter 306. A capacitor 308 is connected between the output of NOR gate 302 and the output of inverter 306. The output of invertor 306 is connected at the first input of a NAND gate 314. The output of NAND gate 314 is connected to an inverter 316 which is in turn connected to an inverter 318. A capacitor 320 is connected between the output of NAND gate 314 and the output of inverter 318.

The output of inverter 318 is connected to an inverter 322 which is in turn connected to an inverter 324. An inverter 326 has the input connected to the output of inverter 324 and has the output thereof connected to a first input of the NAND gate 286.

A plurality of clock signals are generated by the ring oscilator 284. A $\phi A$ signal is generated at the output of inverter 290. A $\phi B$ signal is generated at the output inverter 296. A $\phi C$ is generated at the output of inverter 306. A $\phi D$ signal is generated at the output of inverter 318. A $\phi E$ signal is generated at the output of inverter 326.

The $\phi B$ and $\phi E$ signals are inputs to a NOR gate 332 to produce a clock signal $\phi 2$. The $\phi 2$ signal is transmitted through an inverter 334 to produce $\overline{\phi 2}$. The $\phi B$ signal is input to an inverter 336 to produce a $\phi 3$ signal. A $\overline{\phi 3}$ signal corresponds to $\phi B$. The $\phi A$ and $\phi C$ signals are input to a NAND gate 338 to produce a signal $\overline{\phi 4}$. The output of gate 338 is also transmitted through an inverter 340 to produce a $\phi 4$ signal.

The signals POR and $\overline{VCCOK}$ are input to a NOR gate 342 to produce a signal entitled $\overline{ROSC}$. The output of gate 342 is transmitted through an inverter 344 to produce the signal ROSC. The ROSC signal is provided as the second input to NOR gate 302. The $\overline{ROSC}$ signal is provided as the second input to NAND gate 286 and NAND gate 314. The common designated signals are interconnected to FIG. 6 although specific interconnection lines are not shown.

The circuit 284 oscilates to produce the designated clock signals which are utilized elsewhere in circuit 20.

Figure 10:
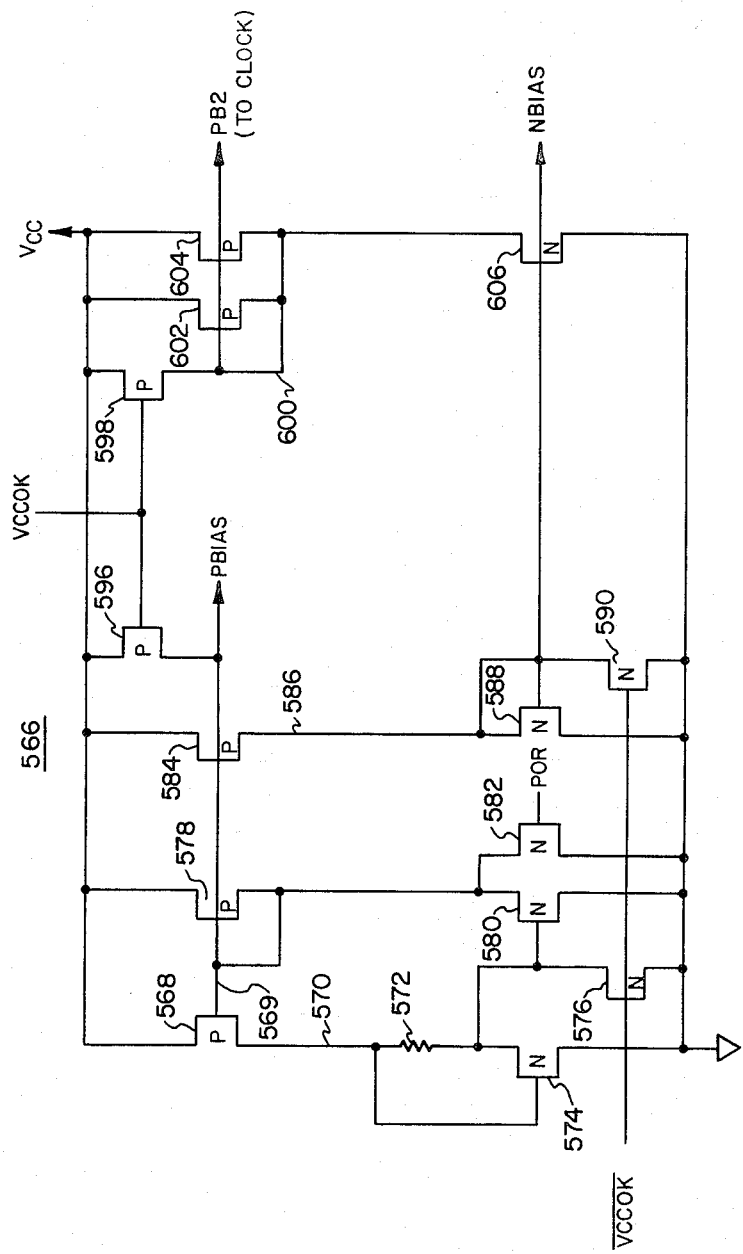
FIG. 10 is a schematic illustration of further circuitry for the VOLTAGE REF circuit shown in FIG. 1.

A bias current signal PB2, shown in FIG. 10, is provided to the circuits comprising inverters 290, 296, 300, 318 and 326. The signal PB2 provides a limiting current flow to the capacitors charged by these inverters to produce a slow rise time on the capacitors.

Figure 7:
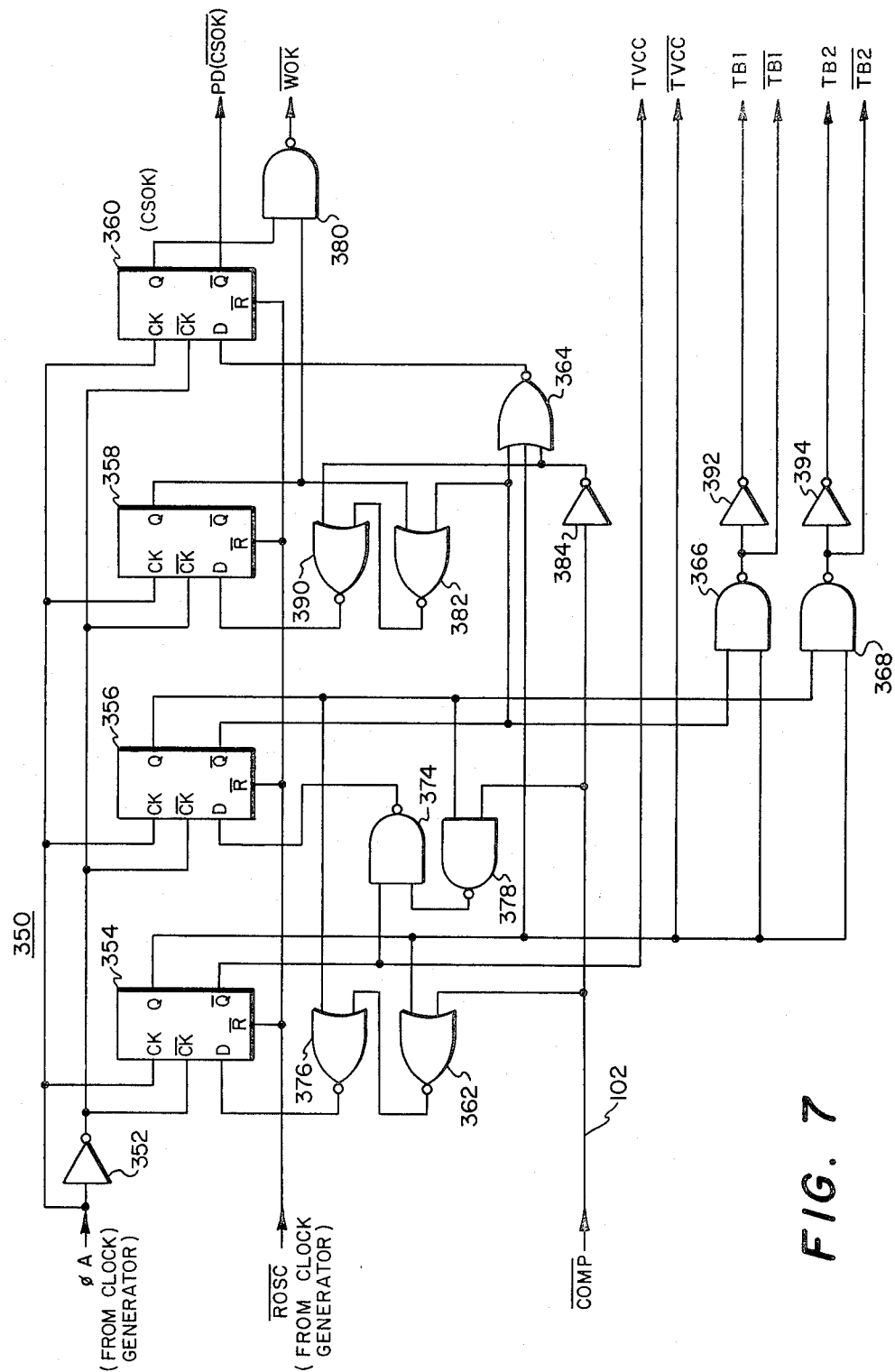
FIG. 7 is a schematic illustration of additional circuitry for the CONTROL LOGIC circuit shown in FIG. 1.

The control logic circuit 92 further includes the combinational and sequential logic circuit 350 which is illustrated in FIG. 7. The $\phi A$ signal is input to an inverter 352 and to the CK input of flip-flop circuits 354, 356, 358 and 360. The output of the inverter circuit 352 is connected to the $\overline{CK}$ inputs of flip-flops 354, 356, 358 and 360. The signal $\overline{ROSC}$ is input to the R inputs of flip-flops 354, 356, 358 and 360. The power down $\overline{(PD)}$ signal CSOK is produced at the Q output of flip-flop 360. The signal $\overline{CSOK}$ for the power down mode is produced at the $\overline{Q}$ output of flip-flop 360.

The Q output of flip-flop 354 is provided as an input to a NOR gate 362, a NOR gate 364, a NAND gate 366 and a NAND gate 368. The $\overline{Q}$ output of flip-flop 354 is provided as an input to a NAND gate 374.

The Q output of flip-flop 356 is provided as a first input to a NOR gate 376, a NAND gate 378 and as the second input to NAND gate 368. The $\overline{Q}$ output of flip-flop 356 is provided as an input to NOR gate 364 and a further input to NAND gate 366.

The Q output of flip-flop 358 is provided as an input to a NAND gate 380 and a NOR gate 382.

The Q output of flip-flop 360 is provided as the second input to NAND gate 380. A comparator output signal, which is described below, is provided as a input to the NOR gate 362, the NAND gate 378 and an inverter 384.

The output of NOR gate 362 is provided as an input to NOR gate 376. The output of NOR gate 376 is connected to the D terminal of flip-flop 354. The output of NAND gate 378 is connected as a second input to NAND gate 374. The output of NAND gate 374 is connected to the D terminal of flip-flop 356.

The output of inverter 384 is connected as a input to NOR gate 364 and as an input to a NOR gate 390. The output of NOR gate 382 is provided as the second input to NOR gate 390. The output of NOR gate 390 is connected to the D terminal of flip-flop circuit 358. The output of NOR gate 364 is connected to the D terminal of flip-flop circuit 360.

The circuit 350 shown in FIG. 7 produces a plurality of switch control signals. Signal TVCC is produced at the $\overline{Q}$ output of flip-flop 354. Signal $\overline{TVCC}$ is produced at the Q output of flip-flop 354. An inverter 392 is connected to the output of NAND gate 360 to produce a signal TB1. A signal $\overline{TB1}$ is produced at the output of NAND gate 360. An inverter 394 is connected to the output of NAND gate 368 and serves to produce a signal TB2. A signal $\overline{TB2}$ is produced directly at the output of NAND gate 368.

Figure 8:
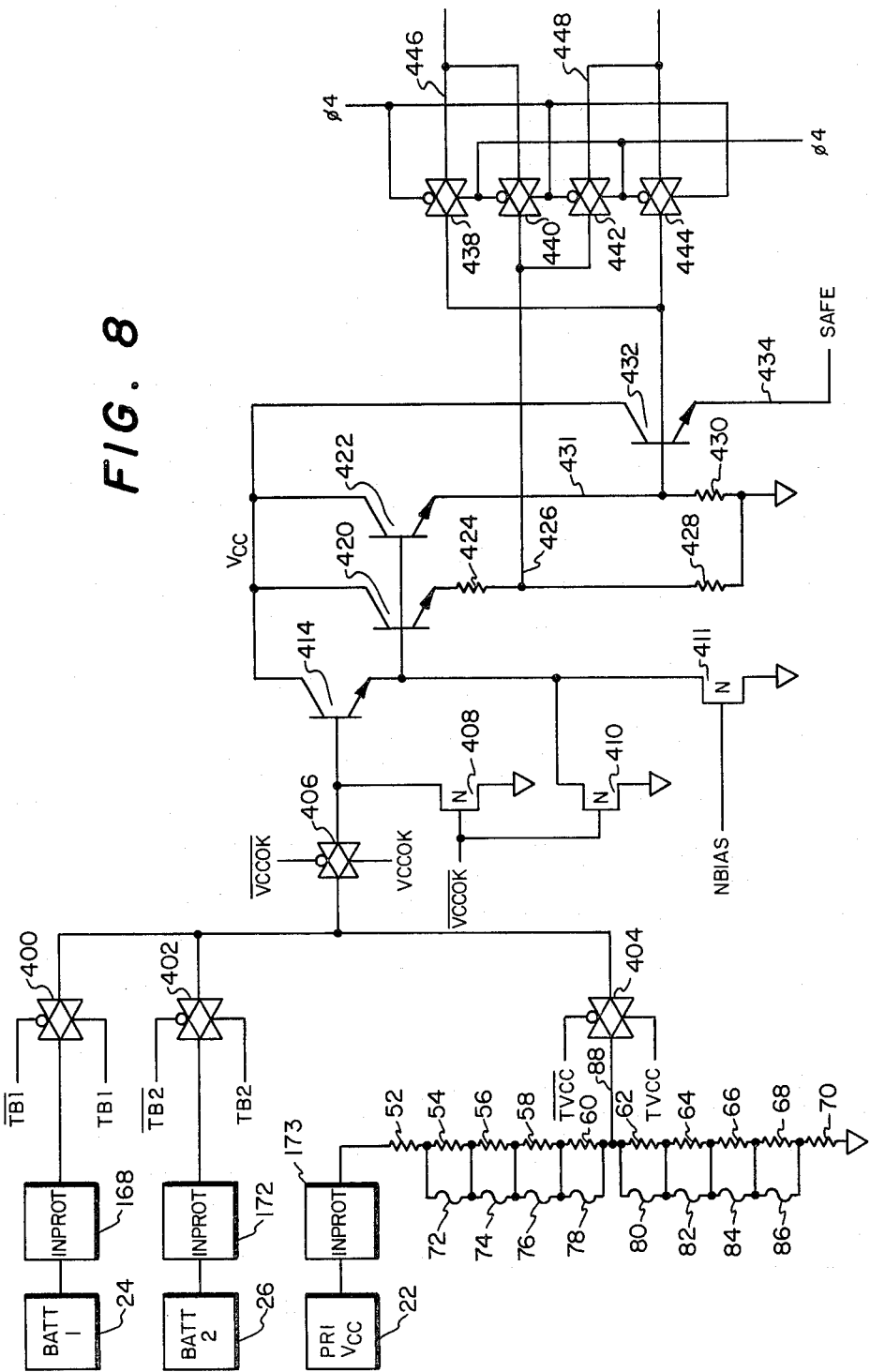
FIG. 8 is a schematic illustration of the analogue switches and a portion of the voltage reference circuit shown in FIG. 1.

Referring now to FIG. 8 there is shown the analog switches 50 together with a portion of the voltage reference circuit 98. The analog switch circuitry comprises switches 400, 402, 404 and 406. Each of these switches has a differential input and serves to transmit an analog signal. The input to switch 400 is the signal TB1 and its complement. The input to switch 402 is the signal TB2 and its complement. The input to switch 404 is the signal TVCC and its complement. The input to switch 406 is the signal VCCOK and its complement.

The primary $V_{cc}$ terminal 22 is connected to an input protection network 173 which is connected to resistor 52.

The battery 1 terminal 24 is connected through input protection circuit 168 to switch 400. The battery 2 terminal 26 is connected through input protection circuit 172 to switch 402. The switch 404 is connected to the node 88 at the junction of the resistors 60 and 62. The input to switch 406 is connected to each of the outputs of switches 400, 402 and 404. The switches 400, 402 and 404 are selectively activated to provide one of three input signals to switch 406. The output of switch 406 is connected to the drain terminal of a transistor 408 which has the source terminal thereof grounded. The signal $\overline{VCCOK}$ is connected to the gate terminals of transistor 408 and a transistor 410. The drain terminal of transistor 410 is connected to a mode 412 and the source terminal of transistor 410 is grounded. A transistor 411 has the drain terminal thereof connected to node 412, the gate terminal thereof connected to receive a signal NBIAS and the source terminal thereof grounded.

The output of switch 406 is connected to the base terminal of a bipolar transistor 414 which has the collector terminal connected to the circuit $V_{cc}$. The emitter terminal of transistor 414 is connected to node 412.

The emitter terminal of transistor 414 is further connected to the base terminals of bipolar transistors 420 and 422 both of which have the collector terminals thereof connected to the circuit $V_{cc}$. The emitter terminal of transistor 420 is connected to a resistor 424 which has the remaining terminal thereof connected to a node 426. A resistor 428 has a first terminal thereof connected to node 426 and a second terminal thereof connected to ground. A resistor 430 has a first terminal connected to the emitter terminal of transistor 422 and to node 431 and a second terminal thereof connected to ground.

A bipolar transistor 432 has the base terminal thereof connected to the emitter terminal of transistor 422, the collector terminal thereof connected to the circuit $V_{cc}$ and the emitter terminal thereof connected to a node 434. A SAFE signal is produced at node 434.

Circuit 20 includes a plurality of signal reversing switches 438, 440, 442 and 444. The signal $\phi 4$ is input to the inverting terminal of switches 438 and 442 and to the noninverting terminal of switches 440 and 444. The signal $\overline{\phi 4}$ is input to the inverting inputs of switches 440 and 444 and to the noninverting input of switches 438 and 442.

The node 426 is connected to the input of switches 440 and 442. The emitter terminal of transistor 422 is connected as the input to switches 438 and 444. The output of switches 438 and 440 are joined together at a node 446. The output of switches 442 and 444 are joined together at a node 448.

The transistors 414, 420, and 422 together with the resistors 424, 428 and 430 function as a band gap voltage reference element. This voltage reference element is designed to detect a threshold voltage of 2.5 volts. This is detected as a summation of the $V_{BE}$ voltages of transistors 414, 420 and 422. The output of the voltage reference element is a differential signal which is input to the switches 438–444. The switches 438–444 function is response to the control signal $\phi 4$ to alternate the connection of the output of the band gap voltage reference element to the nodes 446 and 448. This switching is preferably carried out at a rate of approximately 200 KHZ.

The reference voltage element circuit is essentially temperature insensitive.

Figure 9:
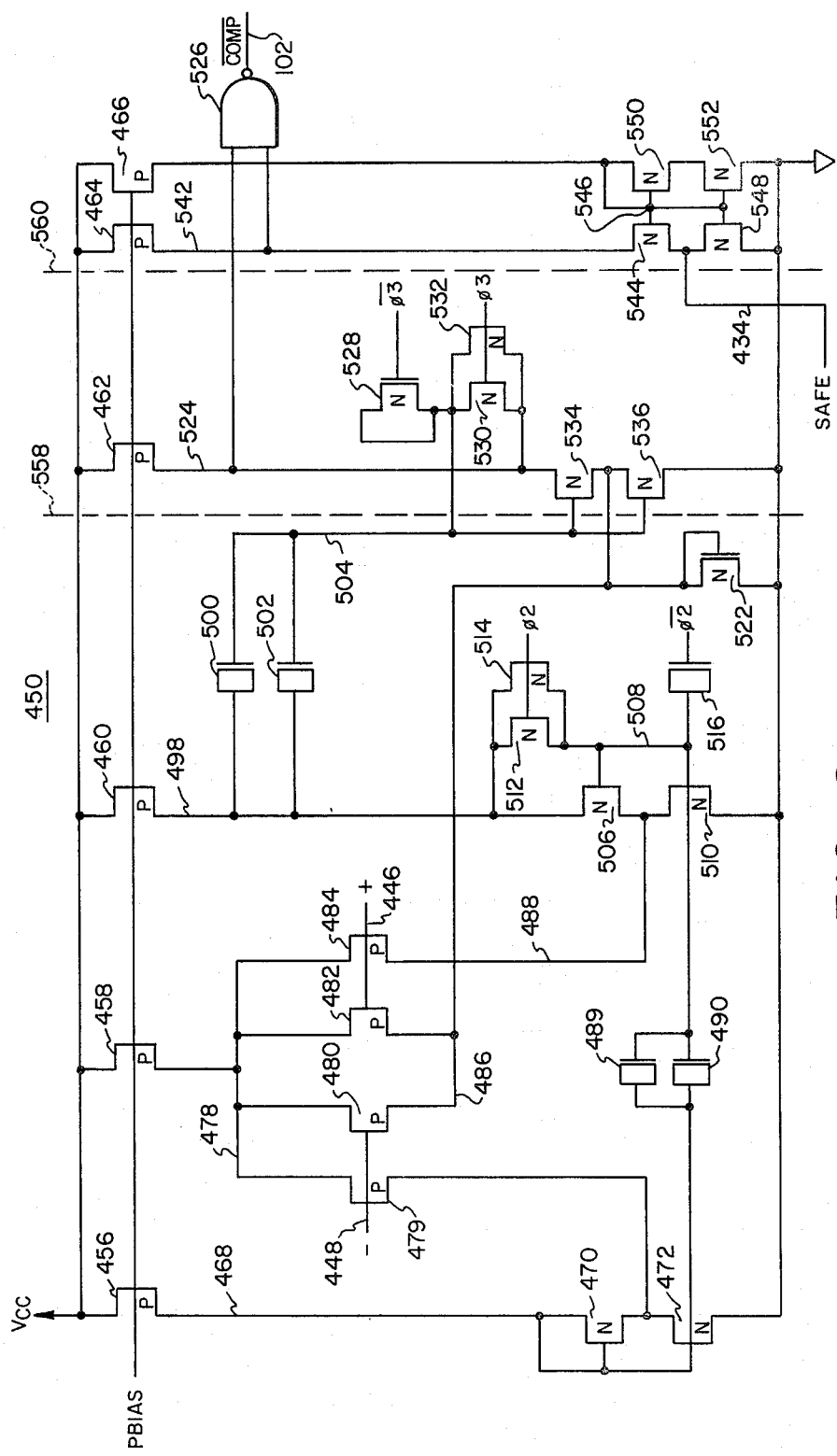
FIG. 9 is a schematic illustration of further circuitry for the VOLTAGE REF circuit shown in FIG. 1.

A further portion of the voltage reference circuit 98 is illustrated in FIG. 9 which shows a chopper stabilized comparator 450. A PBIAS signal, which is described in reference to FIG. 10, is input to the gate terminals of transistors 456, 458, 460, 462, 464 and 466. The transistors 456–466 each have the source terminals thereof connected to the circuit $V_{cc}$.

The drain terminal of transistor 456 is connected to a node 468 which is in turn connected to the gate terminals of transistors 470 and 472. The drain terminal of transistor 470 is connected to node 468. The source terminal of transistor 470 is connected to the drain terminal of transistor 472. The source terminal of transistor 472 is connected to ground.

The source terminal of transistor 458 is connected to a node 478 which is connected to the drain terminal of transistors 479, 480, 482 and 484. The node 448, shown in FIG. 8, is connected to the gate terminals, of transistors 479 and 480. The node 446, also from FIG. 8, is connected to the gate terminals of transistors 482 and 484. The drain terminals of transistors 480 and 482 are connected in common to a node 486. The drain terminal of transistor 484 is connected to a node 488.

Capacitors 489 and 490 are connected in parallel between node 468 and a node 492. These two capacitors could be replaced by a single capacitor.

The drain terminal of transistor 460 is connected to a node 498. Capacitors 500 and 502 are connected in parallel between node 498 and a node 504. These two capacitors could be replaced by a single capacitor. A transistor 506 has the drain terminal thereof connected to node 498, the gate terminal thereof connected to a node 508 and the source terminal thereof connected to node 488. A transistor 510 has the drain terminal thereof connected to node 488, the base terminal thereof connected to node 508 and the source terminal thereof connected to ground.

Transistors 512 and 514 have their drain and source terminals connected together between nodes 498 and 508. The gate terminals of transistors 512 and 514 are connected to receive the signal $\phi 2$. A capacitor 516 has a first terminal connected to node 508 and a second terminal connected to receive the signal $\overline{\phi 2}$.

A transistor 522 has the drain and gate terminals thereof connected to node 486 and the source terminal thereof connected to ground.

The drain terminal of transistor 462 is connected to a node 524 which provides a first input to a NAND gate 526. A transistor 528 has the source and drain terminals connected together to function as a capacitor. The signal $\phi 3$ is provided to the gate terminal of transistor 528. The drain and source terminals of transistor 528 are connected to node 504. Transistors 530 and 532 have the drain and source terminals connected in parallel between nodes 504 and node 524. The gate terminals of transistors 530 and 532 are connected to receive the signal $\phi 3$.

A transistor 534 has the drain terminal thereof connected to node 524, the gate terminal thereof connected to node 504 and the source terminal thereof connected to node 486. A transistor 536 has the drain terminal thereof connected to node 486, the gate terminal thereof connected to node 504 and the source terminal thereof grounded.

The drain terminal of transistor 464 is connected to a node 542 which is in turn connected at the second input to the NAND gate 526. A transistor 544 has the drain terminal thereof connected to node 542, the gate terminal thereof connected to a node 546 and the source terminal thereof connected to the drain terminal of a transistor 548. The signal SAFE on node 434 is connected to the junction of transistors 544 and 548. The gate terminal of transistor 548 is connected to node 546 and the source terminal of transistor 548 is connected to ground.

The drain terminal of transistor 466 is connected to node 546. A transistor 550 has the drain and gate terminals thereof connected to node 546 and the source terminal thereof connected to the drain terminal of a transistor 552. Transistor 552 has the gate terminal thereof connected to node 546 and the source terminal thereof connected to ground.

The operation of circuit 450 is now described in reference to FIG. 9. The differential signals produced by the band gap comparator at nodes 446 and 448 provide the inputs to the comparator 450. The signal PBIAS is input to transistors which form mirror pairs with a current bias transistors shown in FIG. 10. The mirror transistors in FIG. 9 are 456, 458, 460, 462, 464 and 466. The size of each of these transistors is selected to provide the desired current therethrough.

The circuit 450 operates in a repeated sequential fashion in response to the clock signals $\phi 2$ and $\phi 3$. When the clock signal $\phi 2$ is in the high state transistors 512 and 514 are turned on and the capacitors 488 and 490 are charged to a state which balances the offset voltage error of the input circuitry. The first stage of the comparator 450 is that circuitry to the left of a vertical line 558. The second stage of comparator 450 comprises the circuitry between line 558 and line 560.

After the signal $\phi 2$ is in the high state and the capacitors 488 and 490 are charged to compensate for the offset voltage of the first stage of the comparator 450, the clock signal $\phi 2$ goes to a low state and the difference of the input signals at nodes 446 and 448 is amplified and provided at terminal 498.

The complement of signal $\phi 2$ is supplied to capacitor 516 to compensate for the capacitive coupling effect of signal $\phi 2$.

The second stage of comparator 450 operates in essentially the same fashion as the first stage. The clock signal $\phi 3$ periodically turns on transistors 530 and 532 and causes the capacitors 500 and 502 to be charged and store the offset error of first stage of the comparator 450. When the signal $\phi 3$ is in a low state the second stage functions as the conventional amplifier and produces an output at terminal 524.

The signal $\overline{\phi 3}$ is provided to capacitor connected 528 to counteract the capacitive coupling effect of signal $\phi 3$.

The output at terminal 524 is input to NAND gate 526 together with the voltage level at node 542. The resulting output of NAND gate 526 is the comparison output which is input to the circuit 350 illustrated in FIG. 7.

The transistor 522 is connected as a diode clamp and serves as a protective feature against extreme input voltages.

The circuitry to the right of line 560 is a switching circuit which is responsive to the SAFE input signal at node 34 from transistor 432 in FIG. 8. In a selected embodiment the transistors 464 and 466 are the same size and therefore sink the same current, for example 4.0 microamps. The transistors 544 and 548 are essentially the same size but are approximately 2½ times larger than the transistors 550 and 552. The node 546 will go to a voltage state which causes the transistors 550 and 552 to sink the current received from transistor 466. This will, however, cause the voltage at node 542 to go to a low state due to the high conductivity of transistors 544 and 548. But when current is supplied through node 432 due to a small voltage change at that node the current supplied into transistor 548 will cause the voltage at node 542 to go to a high voltage state. A small voltage change at node 434 causes a much greater voltage shift at node 542.

A bias current generator circuit 566 is now described in reference to FIG. 10. The bias current signals generated by circuit 566 are essentially independent of the supply voltage. A transistor 568 has the source terminal thereof connected to the circuit $V_{cc}$, the gate terminal thereof connected to a node 569 which provides the PBIAS signal, and the drain terminal thereof connected to a node 570. A resistor 572 is connected between node 570 and the drain terminal of a transistor 574. The gate terminal of transistor 574 is connected to node 570 and the source terminal thereof is connected to ground.

A transistor 576 has the drain terminal thereof connected to the drain terminal of transistor 574, the gate terminal thereof connected to receive the signal $\overline{VCCOK}$ and the source terminal thereof grounded.

A transistor 578 has the source terminal thereof connected to the circuit $V_{cc}$, and the base and drain terminals thereof connected to node 569. A transistor 580 has the drain terminal thereof connected to node 569, the base terminal thereof connected to the drain terminal of transistor 576 and the source terminal thereof connected to ground. A transistor 582 has the drain terminal thereof connected to node 569, the base terminal thereof connected to receive the signal POR and the source terminal thereof connected to ground.

A transistor 584 has the source terminal thereof connected to the circuit $V_{cc}$, the gate terminal thereof connected to node 569 and the drain terminal thereof connected to a node 586 at which a signal NBIAS is produced.

A transistor 588 has the drain and gate terminals thereof connected to node 586 and the source terminal thereof connected to ground. A transistor 590 has the drain terminal thereof connected to node 586, the gate terminal thereof connected to receive signal $\overline{VCCOK}$ and the source terminal thereof connected to ground.

A transistor 596 has the source terminal thereof connected to the circuit $V_{cc}$, the gate terminal thereof connected to receive the signal VCCOK and the source terminal thereof connected to node 569. A transistor 598 has the source terminal thereof connected to the circuit $V_{cc}$, the gate terminal thereof connected to receive the signal VCCOK and the source terminal thereof connected to a node 600. A signal PB2 is produced at the node 600. A transistor 602 has the source terminal thereof connected to the circuit $V_{cc}$ and the gate and drain terminals thereof connected to node 600. A transistor 604 has the source terminal thereof connected to the circuit $V_{cc}$ and the gate and drain terminals thereof connected to node 600. A transistor 606 has the drain terminal thereof connected to node 600, the gate terminal thereof connected to node 586 and the source terminal thereof connected to ground.

In a selected embodiment of the present invention the signal PBIAS is produced at such a level to produce a mirror current of 4 microamps in corresponding equal sized transistors. The signal PB2 serves to produce a 1 microamp current as supplied to the ring oscillator circuit 284 shown in FIG. 6. The signal NBIAS is used to produce a 2 microamp current in similar size mirror transistors.

In summary the present invention comprises a circuit for selectively connecting a primary power source or a backup battery to operate an integrated circuit. The circuit selects the higher voltage backup battery for operation in the power down mode and continuously monitors the on-line battery and substitutes the off-line battery when the voltage of the on-line battery drops to a low level. Additional control circuitry is provided to disable operations to the integrated circuit to prevent the loss of stored information. In a particular application the write enable signal to a semiconductor memory is disabled to warn of a failure of a backup power source thus eliminating the need for additional signal lines or status words. The power control circuit of this invention is fabricated on-chip as an integral part of an integrated circuit such as a memory.

Although one embodiment of the invention has been illustrated in the accompanying drawings and described in the foregoing detailed description, it will be understood that the invention is not limited to the embodiment disclosed, but is capable of numerous rearrangements, modifications and substitutions without departing from the scope of the invention.

I claim:

1. A method for providing power to an integrated circuit from one of a plurality of sources, comprising the steps of:

providing a primary power source and first and second backup power sources;

comparing the voltages of said first and said second backup power sources to select the backup power source having the higher voltage;

connecting the one of said backup power sources having the higher voltage to supply power to said integrated circuit when the voltage of said primary power source is less than a first predetermined voltage; and disabling input signals to said integrated circuit when the voltage of the power source connected thereto is less than a second predetermined voltage.

2. The method recited in claim 1 including the step of disabling input signals to said integrated circuit when the voltage of the power source connected thereto is less than a predetermined voltage.

3. The method recited in claim 1 including the steps of:

monitoring the voltages of said batteries, and disabling a write enable input signal to said memory when said memory is powered by said primary power source and the voltage of one of said batteries is less than a third predetermined voltage, the disabling of said write enable input signal preventing the writing of data in said memory and serving as a battery failure warning.

4. The method recited in claim 3 wherein said first predetermined voltage is selected to be less than said second predetermined voltage and also is selected to be greater than said third predetermined voltage.

5. A method for providing power to an integrated circuit memory which receives a write enable signal to permit writing of data states in said memory and receives a chip select signal to permit reading of data states in said memory, comprising the steps of:

providing a primary power source and at least one backup power source;

connecting said primary power source to power said memory when the voltage of said primary power source exceeds essentially the voltage of said backup power source;

connecting said backup power source to power said memory when the voltage of said primary power source is less than a first preselected voltage;

disabling said write enable signal provided to said memory when said primary power source is connected to power said memory and the voltage of said backup power source is less than a second preselected voltage; and disabling said write enable signal and said chip select signal provided to said memory when the voltage of said primary power source is less than a third preselected voltage.

6. A power control circuit for connecting one of a plurality of power sources to an integrated circuit, comprising;

a first power terminal for receiving a primary power source;

a second power terminal for receiving a first backup power source;

a third power terminal for receiving a second backup power source;

means for comparing the voltages of said second and said third power terminals and connecting the power terminal having the higher voltage to a power terminal of said integrated circuit when the voltage at said first power terminal is less than a first predetermined voltage; and means for connecting said first power terminal to said integrated circuit power terminal when the voltage at said first power terminal exceeds by a preset threshold the voltage at said integrated circuit power terminal;

means for comparing the voltage at said first power terminal to a second predetermined voltage for producing a control signal; and means responsive to said control signal for disabling the input command signals to said integrated circuit when the voltage at said first power terminal is less than said second predetermined voltage.

7. The power control circuit recited in claim 6 wherein said first predetermined voltage is less than said second predetermined voltage.

8. A power control circuit for connecting one of a plurality of power sources to an integrated circuit memory which receives a write enable signal to permit writing of data states in said memory and receives a chip enable signal to permit reading and writing of data states in said memory, comprising:

a first power terminal for receiving a primary power source;

a second power terminal for receiving a first backup power source;

a third power terminal for receiving a second backup power source;

means for comparing the voltages at said second and said third power terminals to select the one of the two terminals having the higher voltage and for connecting the higher voltage terminal supply to said memory when the voltage at said first power terminal is below a first preselected voltage;

means for connecting said first power terminal to said memory when the voltage at said first power terminal exceeds by a preset threshold the voltage of the higher voltage terminal of said second and third terminals;

means connected to said second and said third power terminals for disabling said write enable signal provided to said memory when the voltage at said second or said third power terminal is less than a second preselected voltage and;

means connected to said first power terminal for disabling said write enable and said chip select signals provided to said memory when the voltage at said first power terminal is less than a third preselected voltage.

9. The power control circuit recited in claim 8 wherein said first preselected voltage is less than said second predetermined voltage and also is greater than said third predetermined voltage.

10. A power control circuit for connecting one of a plurality of power sources to an integrated circuit which receives a write enable signal to permit writing of data states in said memory and receives a chip enable signal to permit reading of data states in said memory comprising circuit elements fabricated integrally with said memory, said power control circuit comprising:

a first power terminal for receiving a primary power source;

a second power terminal for receiving a first backup power source;

a third power terminal for receiving a second backup power source;

means for comparing the voltage at said first power terminal to the voltages at said second and said third power terminals for connecting said first power terminal to said memory when the voltage at said first power terminal exceeds the voltages at said first or second power terminals;

means for comparing the voltages at said second and said third power terminals for selecting one of the terminals having the higher voltage and connecting the higher voltage terminal to said memory when the voltage at said first power terminal is less than that of said higher voltage terminal;

a voltage divider network connected between said first power terminal and ground and having a reference node;

a band gap reference circuit for comparing a reference voltage with the input thereto;

means for periodically connecting the input of said band gap reference circuit to the junction node of said voltage divider network, said second power terminal and said third power terminal;

means connected to said band gap reference circuit for disabling said write enable and said chip enable signals provided to said memory when the voltage at said first power terminal is less than a predetermined voltage; and means connected to said band gap reference circuit for disabling said write enable signal when the voltage at said first power terminal is greater than said reference voltage and the voltage at either said second or said third power terminals in less than a preselected voltage that indicates a defective backup power source, the disabling of said write enable signal indicating that one of said backup power sources is defective.

11. A method of operation for an integrated circuit which is powered by either a primary power source or a backup power source, wherein operation of the integrated circuit is directed by at least one control signal input thereto, comprising the steps of:

connecting said primary power source to power said integrated circuit when the voltage of said primary power source exceeds a first predetermined voltage, connecting said backup power source to power said integrated circuit when the voltage of said primary power source is less than said first predetermined voltage, and disabling said control signal to at least partially suspend operation of said integrated circuit when the voltage of said primary power source is less than a second predetermined voltage different from said first predetermined voltage.

12. A method of operation for an integrated circuit, which is powered by either a primary power source or a backup power source, wherein the operation of the integrated circuit is directed by at least one control signal input thereto, comprising the steps of:

monitoring the voltage of said backup power source, while said integrated circuit is powered by said primary power source, for detecting a failure of said backup power source when the voltage of said backup power source becomes less than a predetermined voltage, and disabling said control signal upon detection of the failure of said backup power source for at least partially suspending the operation of said integrated circuit while said integrated circuit is powered by said primary power source.

13. A method as recited in claim 12 wherein said step of monitoring comprises periodically comparing the voltage of said backup power supply to a reference voltage which serves as said predetermined voltage.

14. A method as recited in claim 12 wherein said step of disabling said control signal comprises inputting said control signal and a disable signal to a NAND gate which produces a selectively disabled control signal.

15. A method of operation for an integrated circuit memory which is powered by either a primary power source or a backup battery, wherein the write function of the memory is controlled by a write enable signal input thereto, comprising the steps of:

monitoring the voltage of said battery, while said memory is powered by said primary power source, for detecting a failure of said battery when the voltage of said battery becomes less than a predetermined voltage, and disabling said write enable signal upon detection of the failure of said battery for suspending the writing of the data into said memory while said memory is owered by said primary power source.

* * * * *